(12) United States Patent
Eom et al.

(10) Patent No.: US 12,205,918 B2
(45) Date of Patent: Jan. 21, 2025

(54) SUBMODULE SEMICONDUCTOR PACKAGE

(71) Applicant: SEMICONDUCTOR COMPONENTS INDUSTRIES, LLC, Phoenix, AZ (US)

(72) Inventors: Jooyang Eom, Gimpo-si (KR); Seungwon Im, Seoul (KR); Maria Cristina Estacio, Lapulapu (PH); Jerome Teysseyre, Scottsdale, AZ (US); Inpil Yoo, Unterhaching (DE)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 326 days.

(21) Appl. No.: 17/664,749

(22) Filed: May 24, 2022

(65) Prior Publication Data
US 2022/0406744 A1 Dec. 22, 2022

Related U.S. Application Data

(60) Provisional application No. 63/203,235, filed on Jul. 14, 2021, provisional application No. 63/202,557,
(Continued)

(51) Int. Cl.
*H01L 23/00* (2006.01)
*H01L 23/373* (2006.01)
(Continued)

(52) U.S. Cl.
CPC .......... *H01L 24/20* (2013.01); *H01L 23/3735* (2013.01); *H01L 24/29* (2013.01);
(Continued)

(58) Field of Classification Search
CPC ..... H01L 24/20; H01L 23/3735; H01L 24/29; H01L 24/32; H01L 23/49575;
(Continued)

(56) References Cited

U.S. PATENT DOCUMENTS

| 7,911,792 B2 | 3/2011 | Liang et al. |
| 8,094,454 B2 | 1/2012 | Lowry |

(Continued)

FOREIGN PATENT DOCUMENTS

| JP | 200557130 A | 3/2005 |
| JP | 2013179104 A | 9/2013 |

OTHER PUBLICATIONS

Evaluation of the PCB-embedding technology for a 3.3 KW converter, Remy C ' Aillaud? , Johan Le Lesle' † , Cyril Buttay? , Florent Morel? , Roberto Mrad† , Nicolas Degrenne†, Stefan Mollov† ? Univ. Lyon, INSA-Lyon, CNRS, Ecole Centrale de Lyon, F-69621 ' † Mitsubishi Electric R&D Centre Europe, 1 allee de Beaulieu F-35708 Rennes, France, 2019.
(Continued)

*Primary Examiner* — Douglas W Owens
(74) *Attorney, Agent, or Firm* — IPTechLaw

(57) ABSTRACT

Implementations of semiconductor devices may include a die coupled over a lead frame, a redistribution layer (RDL) coupled over the die, a first plurality of vias coupled between the RDL and the die, and a second plurality of vias coupled over and directly to the lead frame. The second plurality of vias may be adjacent to an outer edge of the semiconductor device and may be electrically isolated from the die.

20 Claims, 7 Drawing Sheets

Related U.S. Application Data filed on Jun. 16, 2021, provisional application No. 63/202,561, filed on Jun. 16, 2021.

(51) Int. Cl.
   *H01L 23/495* (2006.01)
   *H01L 25/07* (2006.01)

(52) U.S. Cl.
   CPC ........ *H01L 24/32* (2013.01); *H01L 23/49575* (2013.01); *H01L 24/83* (2013.01); *H01L 25/072* (2013.01); *H01L 2224/2101* (2013.01); *H01L 2224/211* (2013.01); *H01L 2224/214* (2013.01); *H01L 2224/2201* (2013.01); *H01L 2224/221* (2013.01); *H01L 2224/29139* (2013.01); *H01L 2224/32225* (2013.01); *H01L 2224/83091* (2013.01); *H01L 2224/8384* (2013.01); *H01L 2924/1811* (2013.01); *H01L 2924/182* (2013.01); *H01L 2924/3512* (2013.01)

(58) Field of Classification Search
   CPC ............... H01L 24/83; H01L 25/072; H01L 2224/2101; H01L 2224/211; H01L 2224/214; H01L 2224/2201; H01L 2224/221; H01L 2924/3512; H01L 24/33; H01L 24/19; H01L 24/73; H01L 23/49562; H01L 2224/04105; H01L 2224/32257; H01L 2224/33181; H01L 2224/73267; H01L 2924/15153; H01L 23/4334; H01L 23/5389; H01L 23/3107; H01L 23/49527
   See application file for complete search history.

(56) References Cited

U.S. PATENT DOCUMENTS

| | | |
|---|---|---|
| 8,680,666 B2 | 3/2014 | Hauenstein |
| 8,934,250 B2 | 1/2015 | Campbell et al. |
| 10,194,559 B2 | 1/2019 | Saito |
| 2007/0145540 A1 | 6/2007 | Mochida |
| 2009/0160046 A1 | 6/2009 | Otremba et al. |
| 2013/0334680 A1* | 12/2013 | Boone ............... H01L 23/49575 438/114 |
| 2014/0117524 A1* | 5/2014 | Kim ...................... H01L 24/20 257/676 |
| 2014/0145319 A1 | 5/2014 | Meinhold et al. |
| 2015/0380386 A1* | 12/2015 | Vincent ................ H01L 21/78 257/773 |
| 2017/0110441 A1* | 4/2017 | Tan ........................ H01L 25/50 |
| 2017/0207306 A1* | 7/2017 | Otremba ........... H01L 23/49524 |
| 2018/0286702 A1 | 10/2018 | Kawashima et al. |
| 2019/0333909 A1 | 10/2019 | Sugita et al. |
| 2020/0098870 A1 | 3/2020 | Estacio et al. |
| 2020/0203268 A1* | 6/2020 | Xu ..................... H01L 23/49582 |
| 2021/0202345 A1* | 7/2021 | Koduri ................. H01L 23/485 |

OTHER PUBLICATIONS

Embedded MOSFET boost for 48V powertrain designs, May 6, 2019 //By Nick Flaherty. https://www.eenewspower.com/en/embedded-mosfet-boost-for-48v-powertrain-designs/.

Optimized Power Modules for Silicon Carbide MOSFET, Guillaume Regnat, Pierre-Olivier Jeanniin, Jeffrey Ewanchuk, David Frey, Stefan Mollov, Jean-Paul Ferrieux, Univ. Grenoble Alpes, CNRS, G2Elab, F-38000, Grenoble, France, Mitsubishi Electric R&D Centre Europe, F-35000, Rennes, France (IEEE 978-1-5090-0737-0/16).

Evolution and Future of Embedding Technology (by Dr Andreas Ostmann), Fraunhofer IZM, Berlin Gustav-Meyer-Allee 25, 13355 Berlin, Germany.

Embedded die for power: a new era for the advanced packaging industry?—An interview with Infineon Technologies and Schweizer Electronic, Printed Nov. 21, 2019. https://www.i-micronews.com/embedded-die-for-power-a-new-era-for-the-advanced-packaging-industry-an-interview-with-infineon-technologies-and-schweizer-electronic/?cn-reloaded=1&cn-reloaded=1.

* cited by examiner

SUBMODULE SEMICONDUCTOR PACKAGE

CROSS REFERENCE TO RELATED APPLICATIONS

This document claims the benefit of the filing dates of U.S. Provisional Patent Application 63/202,557, entitled "Immersion Dual Side Direct Cooling Module" to Oseob Jeon et al. which was filed on Jun. 16, 2021, U.S. Provisional Patent Application 63/202,561, entitled "Immersion Cooling Package" to Seungwon I M et al. which was filed on Jun. 16, 2021, and U.S. Provisional Patent Application 63/203,235, entitled "Dual Side Direct Cooling Power Module Package" to Inpil Yoo et al. which was filed on Jul. 14, 2021, the disclosures of each of which are hereby incorporated entirely herein by reference.

BACKGROUND

1. Technical Field

Aspects of this document relate generally to semiconductor packages. More specific implementations involve semiconductor packages including submodules resistant to deformation under pressure-assisted sintering processes.

2. Background

Semiconductor packages include semiconductor devices which may be or include integrated circuits. Semiconductor devices may include switches, rectifiers, transistors, diodes and other devices. These devices may be used in power electronics which may be found in mobile devices, vehicles, and other computing devices.

SUMMARY

Implementations of semiconductor devices may include a die coupled over a lead frame, a redistribution layer (RDL) coupled over the die, a first plurality of vias coupled between the RDL and the die, and a second plurality of vias coupled over and directly to the lead frame. The second plurality of vias may be adjacent to an outer edge of the semiconductor device and may be electrically isolated from the die.

Implementations of semiconductor devices may include one, all, or any of the following:

A distance between the edge of the RDL and the first plurality of vias may be less than 100 micrometers (um).

A pitch between each via of the first plurality of vias may be 235 um.

The die may be coupled in a cavity within the lead frame.

The RDL may be at least 50 um thick.

The second plurality of vias may be arranged in a single row.

Each via of the first plurality of vias may include a width of at least 150 um.

An outermost edge of the RDL one of extends to an outer perimeter of the die or is within the outer perimeter of the die.

Implementations of semiconductor devices may include a first die coupled over a lead frame, a second die coupled over the lead frame, a first redistribution layer (RDL) coupled over the first die, and a second RDL coupled over the second die. Implementations of semiconductor devices may also include a first plurality of vias coupled between the first RDL and the first die, a second plurality of vias coupled between the second RDL and the second die, and a third plurality of vias coupled over and directly to the lead frame. The second plurality of vias may be adjacent to an outer side of the semiconductor device and may be electrically isolated from the first die and the second die. Various implementations of semiconductor devices may also include a mold compound at least partially encapsulating the first die and the second die and a solder mask coupled between the first RDL and the second RDL.

Implementations of semiconductor devices may include one, all, or any of the following:

A fourth plurality of vias directly coupled over and to the lead frame. The fourth plurality of vias may be electrically isolated from the first die and the second die and may be adjacent to a second outer side of the semiconductor device opposite the first outer side of the semiconductor device.

Each of the third plurality of vias and the fourth plurality of vias may be arranged in a single row.

The first RDL may be entirely within an outer perimeter of the first die and the second RDL may be entirely within an outer perimeter of the second die.

Implementations of semiconductor devices may include a third die and a fourth die coupled over the lead frame.

A distance between an edge of the first RDL and the first plurality of vias may be less than 100 um and a distance between an edge of the second RDL and the second plurality of vias may be less than 100 um.

The first plurality of vias may be coupled over three separate source pads.

Implementations of semiconductor packages may include a semiconductor device coupled between a first substrate and a second substrate. The semiconductor device may include a die coupled over a lead frame, a redistribution layer (RDL) coupled over the die, a first plurality of vias coupled between the RDL and the die, and a second plurality of vias coupled over and directly to the lead frame. The second plurality of vias may be adjacent to an outer edge of the semiconductor device and may be electrically isolated from the die. Implementations of semiconductor packages may also include a package lead frame coupled between the first substrate and the second substrate. The semiconductor device may be bonded to the first substrate and the second substrate through a sintering material.

Implementations of semiconductor packages may include one, all, or any of the following:

A connection pad coupled directly over the first die.

The sintering material may include a silver sintering material.

The RDL may include a plurality of dimples formed therein.

The second plurality of vias may be arranged in a single row.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended semiconductor devices will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such semiconductor devices, and implementing components and methods, consistent with the intended operation and methods.

Figure 1:
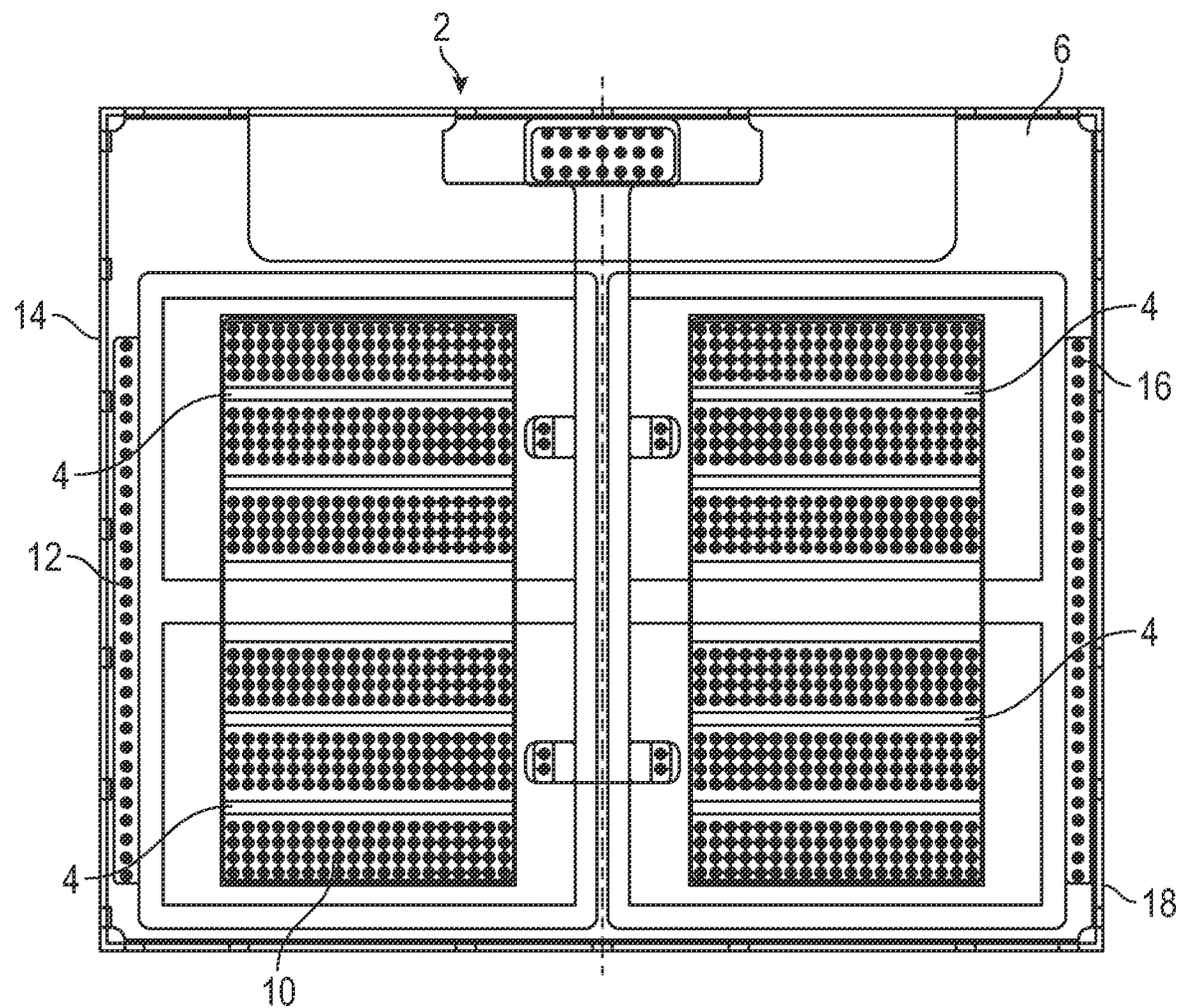
FIG. 1 is a top view of a semiconductor device.
Figure 2:
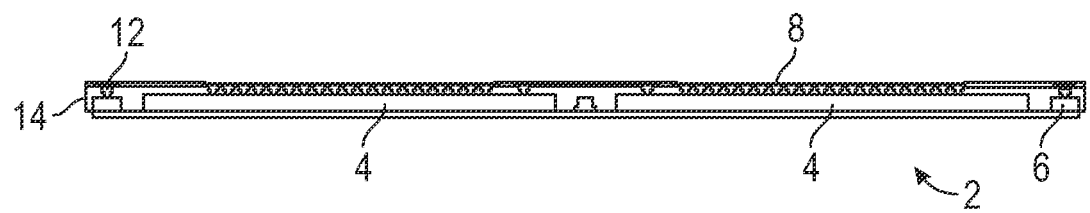
FIG. 2 is a first cross-sectional side view of the semiconductor device of FIG. 1.

Referring to FIG. 1, a top view of the semiconductor device is illustrated. Referring to FIG. 2, a first cross-sectional side view of the semiconductor device of FIG. 1 is illustrated, and referring to FIG. 3, a second cross-sectional side view of the semiconductor device of FIG. 1 is illustrated. The cross-sectional side view of FIG. 2 corresponds to the side of FIG. 1 that FIG. 2 is next to (the bottom side) and the cross-sectional side view of FIG. 3 corresponds to the right side of FIG. 1. In various implementations, the semiconductor device 2 may be a submodule. While the implementations disclosed herein primarily refer to the semiconductor device to as a submodule, it is understood that in other implementations the semiconductor device may not be a submodule. As illustrated by FIG. 1, the semiconductor device 2 includes one or more die 4 coupled over a lead frame 6. While FIG. 1 illustrates the semiconductor devices including four separate die, in other implementations the semiconductor device may include fewer than or more than four die.

Figure 3:
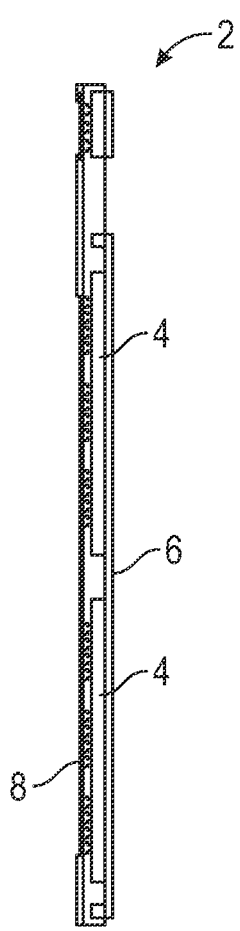
FIG. 3 is a second cross-sectional side view of the semiconductor device of FIG. 1.

As illustrated by FIGS. 2 and 3, the semiconductor device includes a redistribution later (RDL) 8 coupled over each die. Referring to FIG. 1, each RDL is illustrated as transparent in order to illustrate the plurality of vias below. Referring to FIGS. 1-3, the semiconductor device 2 includes a plurality of vias 10 coupled between each die and the RDL above each die. Inasmuch as the semiconductor device of FIG. 1 includes four separate die, FIG. 1 also includes four plurality of vias 10 with one plurality corresponding to each die.

Referring to FIGS. 1 and 2, in various implementations the semiconductor device includes a first plurality of isolated vias 12. In various implementations, the first plurality of isolated vias may be directly coupled to and over the lead frame 6. The first plurality of isolated vias may be adjacent to an outer edge 14 of the semiconductor device 2. In various implementations, semiconductor device 2 may include a second plurality of isolated vias 16 directly coupled to and over the lead frame 6. The second plurality of isolated vias 16 may be adjacent to an outer edge 18 of the semiconductor device 2 opposite the outer edge 14 of the semiconductor device. The isolated vias of the first and second plurality of isolated vias are electrically isolated from each of the one or more die 4 of the semiconductor device 2.

Figure 4:
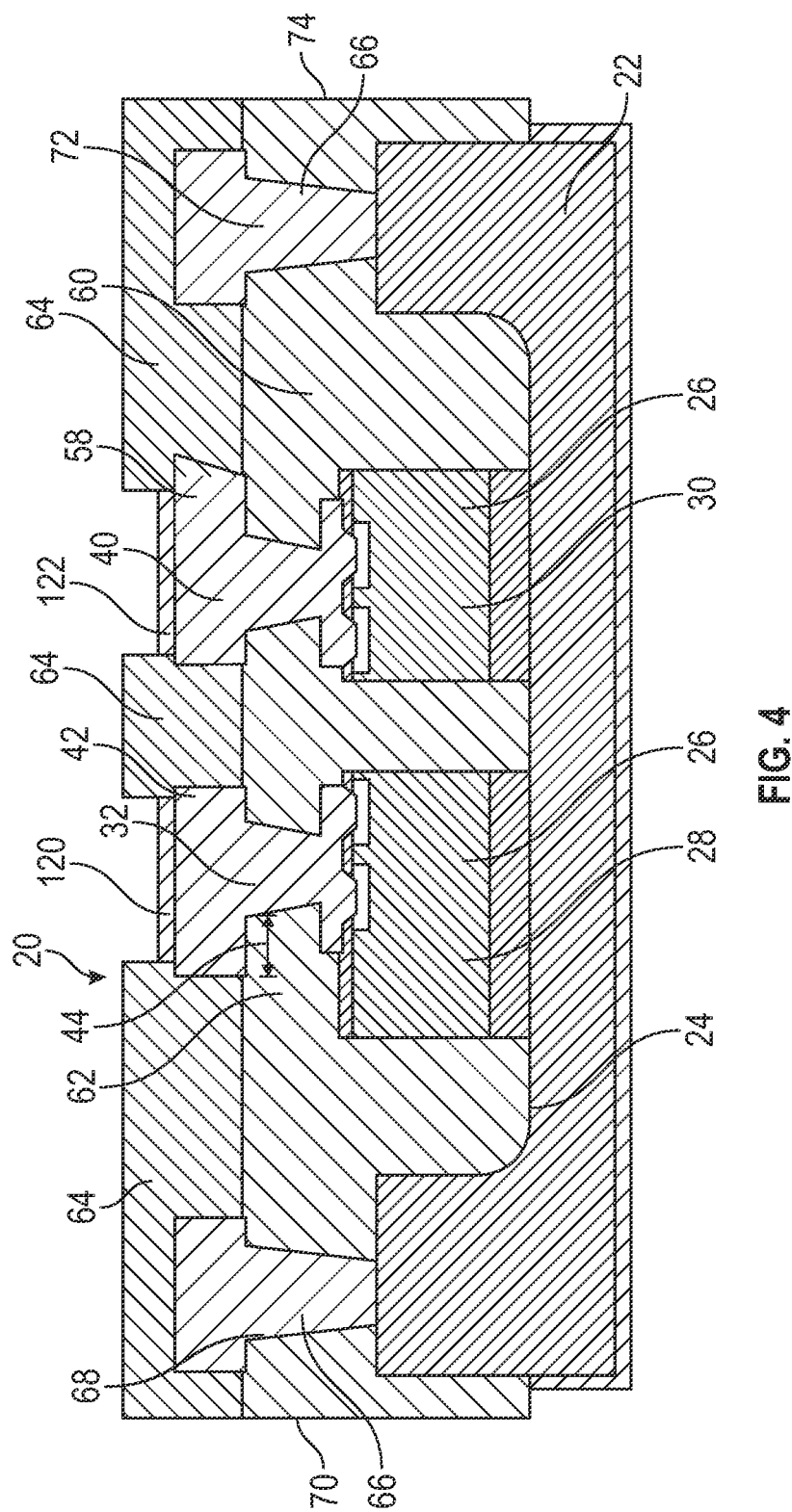
FIG. 4 is a cross-sectional side view of a semiconductor device.

Referring to FIG. 4, a cross-sectional side view of a semiconductor device is illustrated. While FIG. 4 is not drawn to scale, it is illustrated in order to provide a visual understanding of various features and elements the implementations disclosed herein. Accordingly, the semiconductor device to of FIG. 1 may include any of the properties, elements, or features of the semiconductor device illustrated by or described in relation to FIG. 4.

Referring to FIG. 4, the semiconductor device 20 includes a lead frame 22. In various implementations, the lead frame 22 may include a cavity 24. In other implementations, the lead frame does not include a cavity. In various implementations, the lead frame 22 includes a first thickness (as measured at a portion of the lead frame not forming the cavity 24) of at least 300 µm. In other implementations, the first thickness may range from 250-300 µm. In still other implementations, the first thickness of the lead frame may be less than 250 µm or more than 300 µm. In various implementations, the lead frame 22 may include a second thickness (as measured at a portion of the lead frame forming the cavity 24) of 90 µm. In other implementations, the second thickness of the lead frame may be more than or less than 90 µm. In particular implementations, the depth of the cavity 24 may be 210 µm. In other implementations, the depth of the cavity 24 may be between 170-210 µm. In still other implementations, the depth of the cavity may be less than 170 µm or more than 210 µm.

Figure 8:
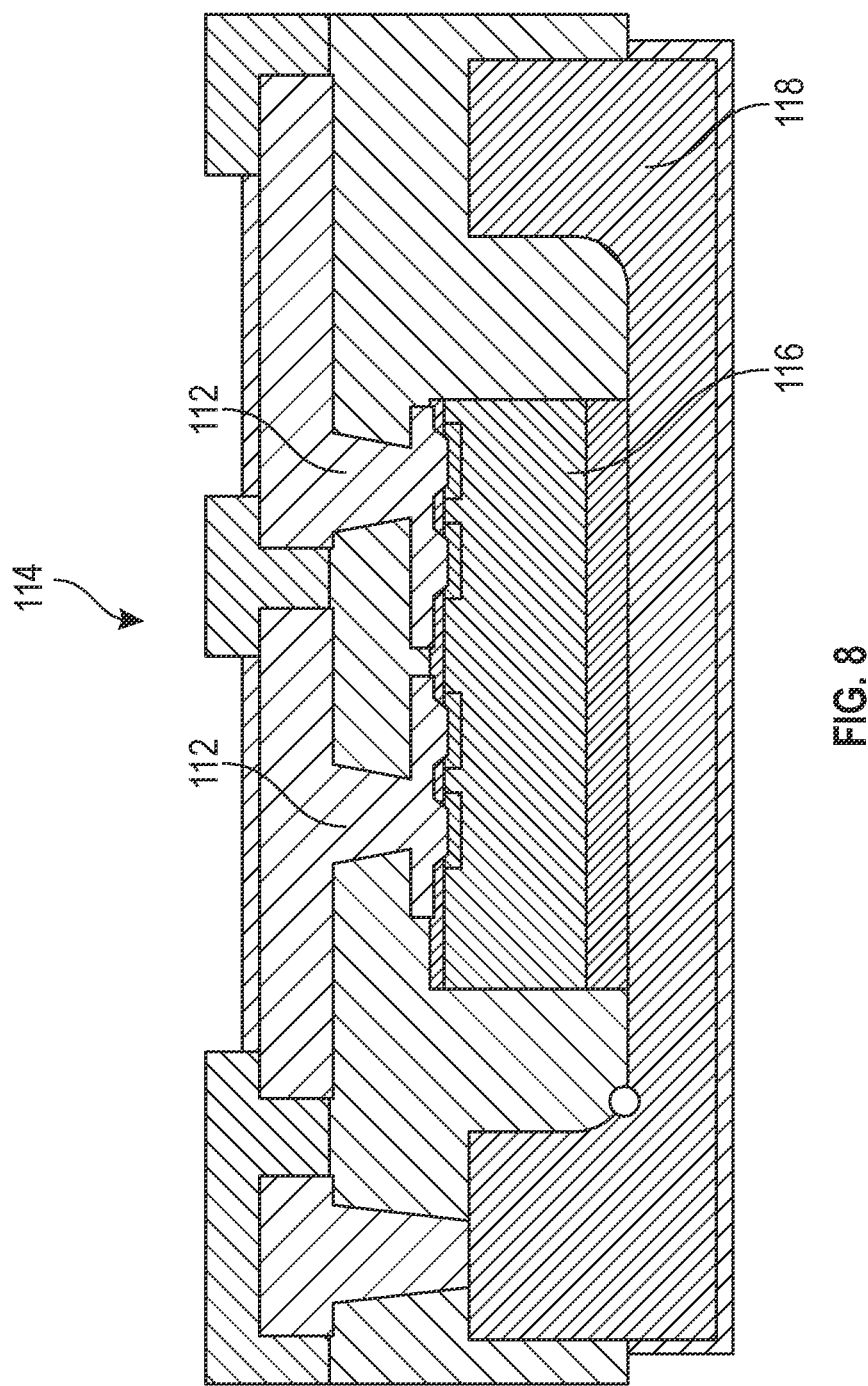
FIG. 8 is a cross-sectional side view of another implementation of a semiconductor device.

In various implementations, the semiconductor device 20 includes one or more die 26. While FIG. 4 illustrates a first die 28 and a second die 30, it is understood that the semiconductor device 20 may include more than two die, including three, four, or any other numbers of die. Referring to FIG. 8, a cross-sectional side view of another implementation of a semiconductor device is illustrated. In other implementations, and as illustrated by FIG. 8, the semiconductor device 114 may include a single die 116 coupled within a cavity of the lead frame 118.

Referring back to FIG. 4, in various implementations the substrates of the one or more die 26 may include silicon carbide (SiC). In other implementations, the substrates of the one or more die 26 may include just silicon (Si). In still other implementations, the substrates of the one or more die 26 may include gallium nitride (GaN) or any other substrate material.

In various implementations, the one or more die 26 may include, by nonlimiting example, a metal oxide semiconductor field effect transistor (MOSFET), an insulating gate bipolar transistor (IGBT), any other type of power semiconductor chip, or any other type of semiconductor chip.

In various implementations, any of the one or more die 26 may be 210 µm thick. In other implementations, any of the one or more die 26 may be more than or less than 210 µm thick.

In various implementations, the semiconductor device may include a plurality of vias 32 formed over the first die 28. While FIG. 4 illustrates the plurality of vias 32 as a single via, it is understood that this single via of FIG. 4 is representative of multiple vias, similar to what is illustrated in FIGS. 1-3. Similarly, the two vias 112 of FIG. 8 are representative of more than two vias, similar to what is illustrated in FIGS. 1-3.

Figure 5:
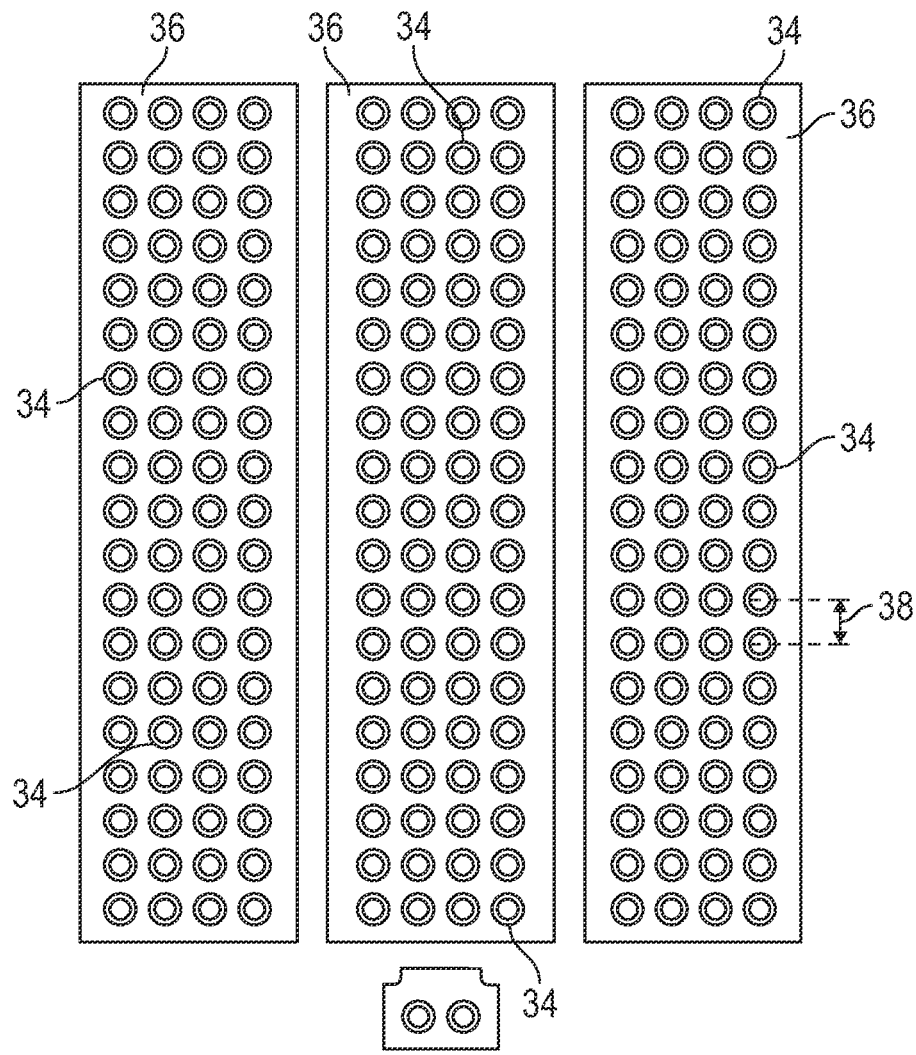
FIG. 5 is a top view of a plurality of vias.

Referring to FIG. 5, a top view of a plurality of vias is illustrated. The first plurality of vias 32 of FIG. 4 may be the same as or similar to the plurality of vias 34 illustrated in FIG. 5. In various implementations, the plurality of vias 34 may include 228 vias. In such implementations, the die of the semiconductor device may include three source pads 36. Each source pad may include 76 vias. In other implementations, the die may include more than or less than 3 source pads. Similarly, in other implementations each source pad may include more than or fewer than 76 vias. In turn, in such implementations the plurality of vias may include more than or fewer than 228 vias. In various implementations, a width of a diameter of each via of the plurality of vias is at least 150 μm. In particular implementations, the width of the diameter of each via of the plurality of vias is 165 μm. In other implementations, the width of the diameter of the vias may be less than 150 μm, between 150-165 μm, or more than 165 μm.

Still referring to FIG. 5, in various implementations the plurality of vias 34 may include a pitch 38, or a distance between a via and an adjacent via, of 235 μm. In other implementations, the plurality of vias may include a pitch more than or less than 235 μm.

Referring back to FIG. 4, in various implementations the semiconductor device may include a second plurality of vias 40 coupled over the second die 30. Like the first plurality of vias 32, while the second plurality of vias 40 is illustrated as a single via, it is understood to represent multiple vias. The second plurality of vias 40 may be the same as or similar to the first plurality of vias 32. In various implementations, the semiconductor device may include a plurality of vias over each die of the semiconductor device. This is illustrated by at least FIG. 1, which illustrates four die and for separate plurality of vias coupled over the four die.

Still referring to FIG. 4, in various implementations the semiconductor device includes a first RDL 42. The first RDL 42 may be directly coupled over and to the first plurality of vias 32. In various implementations, the first RDL 42 includes a thickness of at least 50 μm. In particular implementations, the thickness of the first RDL is 64 μm. In other implementations, the thickness of the RDL may be less than 50 μm, between 50-64 μm, or more than 64 μm.

Figure 6:
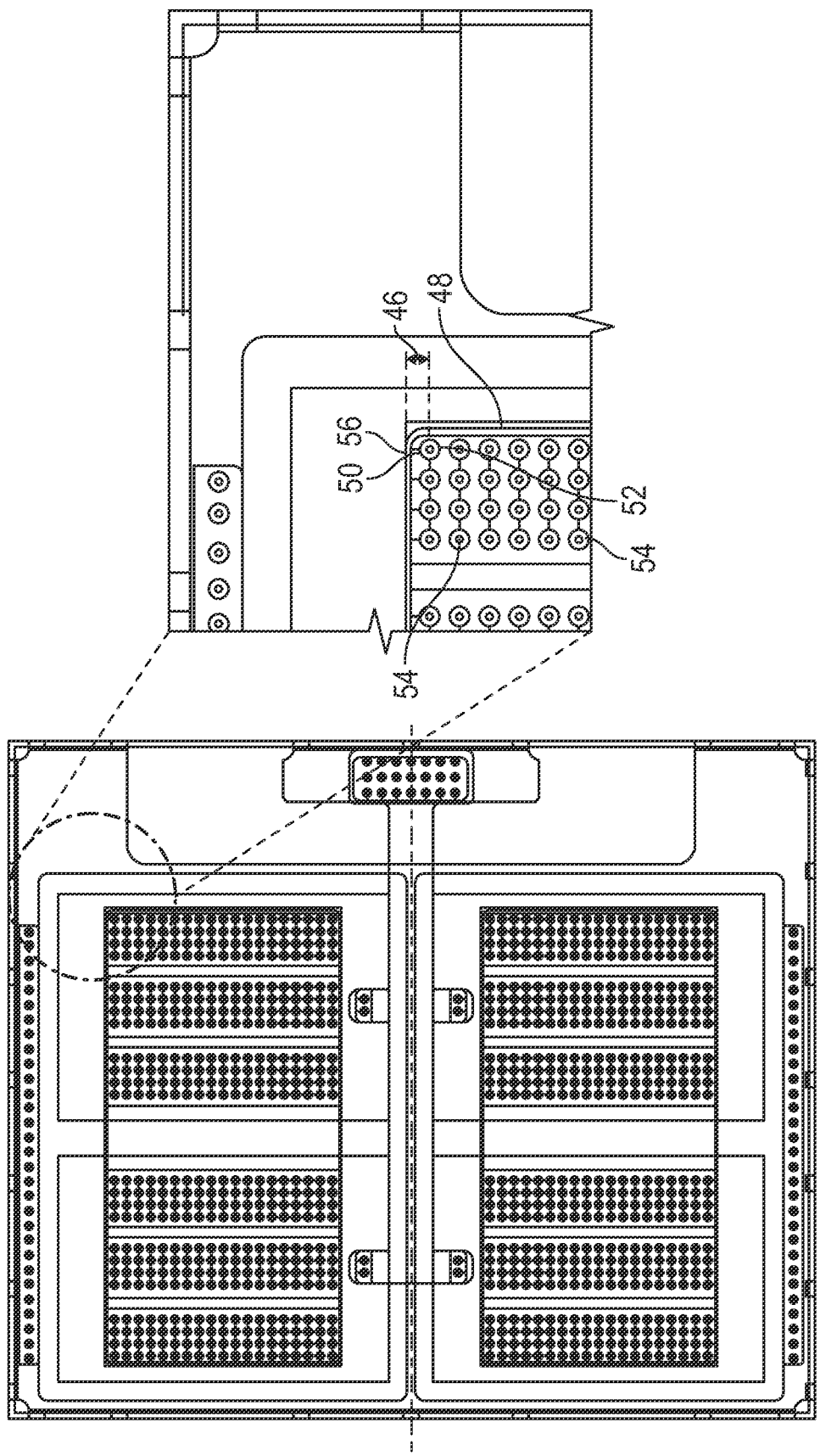
FIG. 6 is a view of the semiconductor device of FIG. 1 including a magnified view of the overhang of a redistribution layer.

In various implementations, the first RDL 42 includes an overhang 44 of not more than 100 μm. As used herein, overhang refers to the distance the RDL extends from the edge of the outermost via to the outer edge of the RDL. This is further illustrated by FIG. 6. Referring to FIG. 6, a view of the semiconductor device of FIG. 1 including a magnified view of the overhang of the RDL of FIG. 1 is illustrated. As illustrated by the magnified portion, the overhang 46 of the RDL 48 is measured from an outermost edge 50 of an outermost via 52 of the plurality of vias 54 to an outermost edge 56 of the RDL 48. In particular implementations, the overhang of any RDL disclosed herein may be 76 μm. In other limitations, the overhang of any RDL disclosed herein may be less than 76 μm, between 76-100 μm, or more than 100 μm.

In implementations where the semiconductor device is formed through an application of pressure, including high center pressure, having an overhang of less than 100 μm, the RDL may be prevented from collapsing at portions of the RDL not sufficiently supported by the plurality of vias.

Referring back to FIG. 4, the first RDL 42 may be only located above the first die 28. In such implementations, the outer perimeter of the first RDL 42 may not extend beyond an outer perimeter of the first die 28. In such implementations, pressure applied to the RDL during formation of the semiconductor device may be concentrated above the source pads of the die which are fully supported by the first plurality of vias. This may further prevent deformation of the first RDL 42.

Still referring to FIG. 4, the semiconductor device 20 may include a second RDL 58 directly coupled over and to the second plurality of vias 40. As illustrated by FIG. 1, the semiconductor device may include a separate RDL for each plurality of vias. In various implementations, these RDLs may be electrically isolated from one another. In other implementations, these RDLs may be electrically coupled to any of the different plurality of vias or with one another.

In various implementations, the semiconductor device may include a connection pad directly coupled over each die. As illustrated by FIG. 4, the semiconductor device 20 includes a first connection pad 120 directly coupled to the first RDL 42 and also coupled directly over the first die. Similarly, the semiconductor device 20 includes a second connection pad 122 directly coupled to the second RDL 58 and also coupled directly over the second die 30.

As illustrated by FIG. 4, in various implementations the semiconductor device 20 includes a mold compound 60 formed over the one or more die 26. In various implementations, a thickness of the portion 62 of the mold compound 60 formed directly over the one or more die 26 may be at least 80 μm. In particular implementations, the thickness may be 95 μm. In other implementations, the thickness may be less than 80 μm, between 80 and 95 μm, or more than 95 μm. In implementations where the portion 62 of the mold compound 60 is at least 80 μm thick, this thickness may increase the clearance from the die surface and may prevent die surface damage during pressure sintering of the semiconductor device in case the mold compound 60 softens.

In various implementations, the mold compound 60 may include a glass transition temperature (TG) of at least 260° C. In particular implementations, the mold compound may include a TG of between 260-280° C. In still other implementations, the mold compound may include a TG of more than 280° C. or less than 260° C. As used herein, the glass transition temperature is defined as the point at which the mold compound transitions from a rigid solid to a more flexible, rubbery compound. In implementations having a mold compound 60 having a TG of at least 260° C., softening of the mold compound during pressure sintering of the semiconductor device may be prevented, in turn reducing damage to the semiconductor device 20 during formation of the semiconductor device.

Still referring to FIG. 4, in various implementations the semiconductor device 20 may include a solder mask 64 formed over portions of the first RDL 42, the second RDL 58, the mold compound 60, and/or the one or more plurality of the isolated vias 66. In various implementations, a thickness of the solder mask 64 directly over the first RDL 42, the second RDL 58, and/or the one or more plurality of isolated vias 66 may be at least 25 μm. In other implementations, this thickness may be more than 25 μm or less than 25 μm. In particular implementations, the solder mask 64 may be coupled between the first RDL 42 and the second RDL 58. In implementations including the solder mask, the solder mask may serve as a buffer layer in the event that the mold compound 60 begins to deform during the application of heat and/or pressure during formation of the semiconductor device. In other implementations, the semiconductor device 20 may not include a solder mask 64.

Still referring to FIG. 4, in various implementations the semiconductor device may include one or more plurality of isolated vias 66. While FIG. 4 illustrates a single via in each plurality of isolated vias, it is understood that the isolated vias 66 illustrated by FIG. 4 are each representative of multiple vias, similar to what is illustrated by FIG. 1, in which the first plurality of isolated vias 12 and the second plurality of isolated vias 16 art each illustrated as including multiple vias. As illustrated by each of FIGS. 1 through 3 and FIG. 4, the plurality of isolated vias may be adjacent to an outer edge of the semiconductor device 20. As illustrated by FIG. 4, the first plurality of isolated vias 68 is adjacent to a first outer edge 70 of the semiconductor device and the second plurality of vias 72 is adjacent to a second outer edge 74 of the semiconductor device. In other implementations, the one or more plurality of isolated vias 66 may be further set in from the outer edges of the semiconductor device 20 or may be positioned closer to the outer edges of the semiconductor device 20 than what is illustrated by FIG. 4.

While each of FIGS. 1-4 illustrate a semiconductor device as having two pluralities of isolated vias, it is understood that other implementations of semiconductor devices may include only a single plurality of isolated vias or more than 2 pluralities of isolated vias. In various implementations, the vias in each plurality of isolated vias may be arranged in a single straight line. In other implementations, the plurality of isolated vias may include multiple lines or other various patterns of vias.

The plurality of isolated vias 66 may be directly coupled to and over the lead frame 22. In implementations including lead frame having a cavity 24, the plurality of isolated vias 66 may be directly coupled over the thicker portion of the lead frame not including the cavity. The plurality of isolated vias 66 are electrically isolated from the one or more die 26. In various implementations, each of the one or more plurality of isolated vias may include an RDL coupled directly over the isolated vias. In such implementations of semiconductor devices including one or more plurality of isolated vias, the isolated vias may support the planarity of the RDL of the semiconductor device and add structural support to the semiconductor device during the formation of the semiconductor device, which may include pressure sintering the semiconductor device.

In various implementations, any RDL coupled over any plurality of vias disclosed herein may include a plurality of dimples formed therein (or a dimpled surface) on the surface of the RDL opposing the surface of the RDL directly coupled to the vias. In such implementations, the dimpled surface may improve connection to either the solder mask or a sinter material when a solder mask is not directly coupled over the RDL. The formation of the dimpled surface may be controlled.

In any or all of the implantations disclosed herein having any or all of the features of an RDL having a thickness of at least 50 µm, the vias of the plurality of vias having a diameter of at least 150 µm, the pitch between the plurality of vias being less than 300 µm, the RDL overhang being less than 100 µm, the solder mask, a minimum of 80 µm of clearance from the die surface, a lead frame at least 300 µm thick, the mold compound having a TG of at least 260° C., and/or the isolated vias, the likelihood of damaging the semiconductor device while forming the semiconductor device through pressure sintering may be reduced and/or eliminated. More specifically, any or all of these elements may prevent the RDL from deforming, the die from cracking, the semiconductor device from shorting, and/or any other damage or deformation to the semiconductor device during formation of the semiconductor device using pressure sintering.

Figure 7:
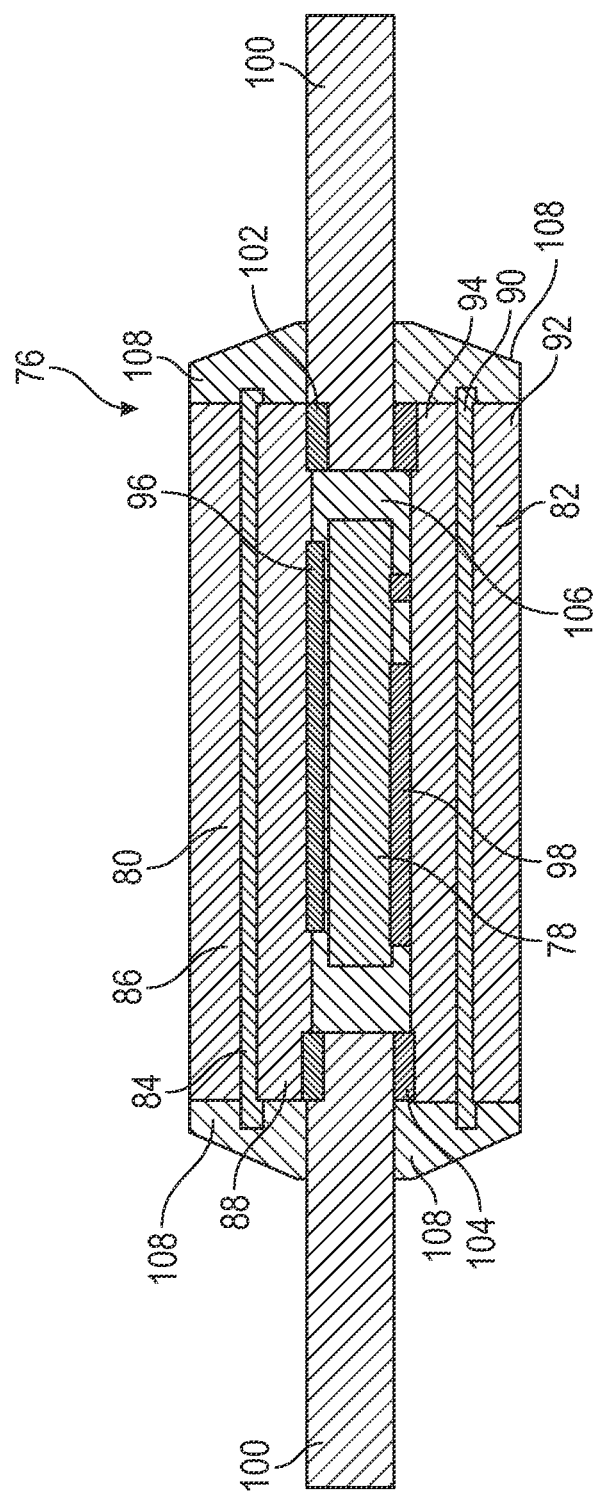
FIG. 7 is a cross-sectional side view of a semiconductor package.

Referring to FIG. 7, a cross-sectional side view of a semiconductor package is illustrated. In various implementations, the semiconductor package 76 may include a semiconductor device 78, or submodule, which may be the same as or similar to any other semiconductor device or submodule disclosed herein. In various implementations, the semiconductor package 76 may be a dual side cooling semiconductor package. In such implementations, the semiconductor package 76 may include a first substrate 80 and a second substrate 82. The semiconductor device 78 may be coupled between the first substrate 80 and the second substrate 82. In various implementations, either the first substrate 80, the second substrate 82, or both the first substrate 80 and the second substrate 82 may be direct bonded copper substrate's. In such implementations, and as illustrated by FIG. 7, the first substrate 80 may include a substrate 84 coupled between a first copper layer 86 and a second copper layer 88. Similarly, the second substrate 82 may include a substrate 90 coupled between a first copper layer 92 and a second copper layer 94. Heat may be dispersed through the first copper layer 86 and through the second copper layer 94.

In various implementations, the semiconductor device 78 may be coupled to the first substrate 80 through a first sintering material 96 and may also be coupled to the second substrate 82 through a second sintering material 98. In particular implementations, the first sintering material and the second sintering material may be a silver sintering material. In other implementations, either of the first sintering material or the second sintering material may include a non-silver sintering material. In various implementations, the semiconductor package 76 may include a lead frame 100 coupled between the first substrate 88 and the second substrate 82. In such implementations, the lead frame 100 may be coupled to the first substrate 80 through a first sintering material 102 and coupled to the second substrate 82 through a second sintering material 104. In various implementations, the semiconductor package 76 may include a first mold compound 106 formed around the semiconductor device 78. The semiconductor package 76 may also include a second mold compound 108 formed around the first substrate 80 and the second substrate 82.

In places where the description above refers to particular implementations of semiconductor devices and implementing components, sub-components, methods and sub-methods, it should be readily apparent that a number of modifications may be made without departing from the spirit thereof and that these implementations, implementing components, sub-components, methods and sub-methods may be applied to other semiconductor devices.

What is claimed is:

1. A semiconductor device comprising:
   a die coupled over a lead frame;
   a redistribution layer (RDL) coupled over the die;
   a first plurality of vias coupled between the RDL and the die; and
   a second plurality of vias coupled over and directly to the lead frame, wherein the second plurality of vias are adjacent to an outer edge of the semiconductor device and are electrically isolated from the die.

2. The semiconductor device of claim 1, wherein a distance between an edge of the RDL and the first plurality of vias is less than 100 micrometers (um).

3. The semiconductor device of claim 1, wherein a pitch between each via of the first plurality of vias is 235 um.

4. The semiconductor device of claim 1, wherein the die is coupled in a cavity within the lead frame.

5. The semiconductor device of claim 1, wherein the RDL is at least 50 um thick.

6. The semiconductor device of claim 1, wherein the second plurality of vias are arranged in a single row.

7. The semiconductor device of claim 1, wherein each via of the first plurality of vias comprises a width of at least 150 um.

8. The semiconductor device of claim 1, wherein an outermost edge of the RDL one of extends to an outer perimeter of the die or is within the outer perimeter of the die.

9. A semiconductor device comprising:
a first die coupled over a lead frame;
a second die coupled over the lead frame;
a first redistribution layer (RDL) coupled over the first die;
a second RDL coupled over the second die;
a first plurality of vias coupled between the first RDL and the first die;
a second plurality of vias coupled between the second RDL and the second die;
a third plurality of vias coupled over and directly to the lead frame, wherein the third plurality of vias are adjacent to an outer side of the semiconductor device and are electrically isolated from the first die and the second die;
a mold compound at least partially encapsulating the first die and the second die; and
a solder mask coupled between the first RDL and the second RDL.

10. The semiconductor device of claim 9, further comprising a fourth plurality of vias directly coupled over and to the lead frame, wherein the fourth plurality of vias are electrically isolated from the first die and the second die and are adjacent to a second outer side of the semiconductor device opposite the first outer side of the semiconductor device.

11. The semiconductor device of claim 10, wherein each of the third plurality of vias and the fourth plurality of vias are arranged in a single row.

12. The semiconductor device of claim 9, wherein the first RDL is entirely within an outer perimeter of the first die and the second RDL is entirely within an outer perimeter of the second die.

13. The semiconductor device of claim 9, further comprising a third die and a fourth die coupled over the lead frame.

14. The semiconductor device of claim 9, wherein a distance between an edge of the first RDL and the first plurality of vias is less than 100 um and a distance between an edge of the second RDL and the second plurality of vias is less than 100 um.

15. The semiconductor device of claim 9, wherein the first plurality of vias are coupled over three separate source pads.

16. A semiconductor package comprising:
a semiconductor device coupled between a first substrate and a second substrate, wherein the semiconductor device comprises:
a die coupled over a lead frame;
a redistribution layer (RDL) coupled over the die;
a first plurality of vias coupled between the RDL and the die; and
a second plurality of vias coupled over and directly to the lead frame;
wherein the second plurality of vias are adjacent to an outer edge of the semiconductor device and are electrically isolated from the die; and
a package lead frame coupled between the first substrate and the second substrate;
wherein the semiconductor device is bonded to the first substrate and the second substrate through a sintering material.

17. The semiconductor package of claim 16, further comprising a connection pad coupled directly over the die.

18. The semiconductor package of claim 16, wherein the sintering material comprises a silver sintering material.

19. The semiconductor package of claim 16, wherein the RDL comprises a plurality of dimples formed therein.

20. The semiconductor package of claim 16, wherein the second plurality of vias are arranged in a single row.

* * * * *